(12) United States Patent
Yoneyama et al.

(10) Patent No.: US 9,613,888 B2
(45) Date of Patent: Apr. 4, 2017

(54) SEMICONDUCTOR DEVICE AND SEMICONDUCTOR MODULE

(71) Applicant: MITSUBISHI ELECTRIC CORPORATION, Tokyo (JP)

(72) Inventors: Rei Yoneyama, Tokyo (JP); Hiroyuki Okabe, Tokyo (JP); Nobuya Nishida, Tokyo (JP); Taichi Obara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/152,796

(22) Filed: Jan. 10, 2014

(65) Prior Publication Data

US 2014/0291825 A1   Oct. 2, 2014

(30) Foreign Application Priority Data

Apr. 2, 2013 (JP) ................. 2013-076525

(51) Int. Cl.
*H01L 23/495* (2006.01)
*H01L 23/00* (2006.01)

(52) U.S. Cl.
CPC .... *H01L 23/4952* (2013.01); *H01L 23/49503* (2013.01); *H01L 23/49513* (2013.01); *H01L 23/49548* (2013.01); *H01L 23/49575* (2013.01); *H01L 24/32* (2013.01); *H01L 24/73* (2013.01); *H01L 2224/27013* (2013.01); *H01L 2224/32245* (2013.01); *H01L 2224/45144* (2013.01); *H01L 2224/48137* (2013.01); *H01L 2224/48247* (2013.01); *H01L 2224/48464* (2013.01); *H01L 2224/73265* (2013.01);
(Continued)

(58) Field of Classification Search
CPC .......... H01L 23/4952; H01L 23/49548; H01L 23/49575; H01L 23/49503
See application file for complete search history.

(56) References Cited

U.S. PATENT DOCUMENTS 5,164,815 A * 11/1992 Lim .................... H01L 23/4951
257/618
5,440,169 A    8/1995 Tomita et al.
(Continued)

FOREIGN PATENT DOCUMENTS

CN    101030570 A    9/2007
CN    101393900 A    3/2009
(Continued)

OTHER PUBLICATIONS

An Office Action issued by the German Patent Office on Dec. 2, 2014, which corresponds to German Patent Application No. 10 2014 202 651.2 and is related to U.S. Appl. No. 14/152,796; with English language partial translation.
(Continued)

*Primary Examiner* — Michele Fan
(74) *Attorney, Agent, or Firm* — Studebaker & Brackett PC

(57) ABSTRACT

A semiconductor device in the preferred embodiment includes: a lead frame comprising a die pad and an electrode terminal; and at least one semiconductor chip bonded to a surface of the die pad, wherein the lead frame excluding a bottom surface thereof and the semiconductor chip are sealed by a sealing resin, and an unevenness is introduced on a bonding interface between the surface of the die pad and the semiconductor chip.

14 Claims, 5 Drawing Sheets

(52) U.S. Cl.
CPC ........... *H01L 2224/83385* (2013.01); *H01L 2924/10158* (2013.01); *H01L 2924/12042* (2013.01); *H01L 2924/181* (2013.01); *H01L 2924/351* (2013.01)

(56) References Cited

U.S. PATENT DOCUMENTS

| | | | |
|---|---|---|---|
| 5,554,569 A * | 9/1996 | Ganesan | H01L 21/4821 257/E23.037 |
| 5,891,758 A * | 4/1999 | Honda | H01L 21/565 174/539 |
| 5,969,461 A * | 10/1999 | Anderson et al. | 310/313 R |
| 6,166,430 A | 12/2000 | Yamaguchi | |
| 6,184,064 B1 * | 2/2001 | Jiang | H01L 24/32 257/739 |
| 6,256,200 B1 * | 7/2001 | Lam | H01L 24/84 257/669 |
| 6,306,684 B1 * | 10/2001 | Richardson | H01L 23/49513 156/153 |
| 6,329,706 B1 | 12/2001 | Nam | |
| 6,642,609 B1 | 11/2003 | Minamio et al. | |
| 7,060,535 B1 * | 6/2006 | Sirinorakul | H01L 21/4832 257/702 |
| 7,166,905 B1 * | 1/2007 | Shah | H01L 23/49503 257/666 |
| 7,947,532 B2 * | 5/2011 | Otremba | H01L 23/49524 257/678 |
| 8,373,258 B2 | 2/2013 | Mizusaki et al. | |
| 8,716,873 B2 * | 5/2014 | Wang | H01L 21/4832 257/690 |
| 9,006,871 B2 * | 4/2015 | Fujisawa | H01L 23/3107 257/663 |
| 2001/0009301 A1 | 7/2001 | Azuma | |
| 2002/0031869 A1 * | 3/2002 | Minamio et al. | 438/127 |
| 2002/0089053 A1 * | 7/2002 | Liu | H01L 21/4832 257/690 |
| 2002/0163078 A1 * | 11/2002 | Chai | H01L 23/3107 257/730 |
| 2003/0134450 A1 * | 7/2003 | Lee | 438/106 |
| 2003/0141577 A1 * | 7/2003 | Hung | H01L 23/3107 257/676 |
| 2003/0178708 A1 | 9/2003 | Minamio et al. | |
| 2004/0217450 A1 | 11/2004 | Li et al. | |
| 2005/0046008 A1 * | 3/2005 | Gai | H01L 23/3107 257/690 |
| 2006/0038266 A1 * | 2/2006 | Song | H01L 21/6835 257/676 |
| 2006/0081967 A1 * | 4/2006 | Ha | H01L 23/3107 257/676 |
| 2006/0097366 A1 * | 5/2006 | Sirinorakul et al. | 257/666 |
| 2007/0164403 A1 * | 7/2007 | Huang | H01L 21/561 257/666 |
| 2007/0215999 A1 | 9/2007 | Kashimoto et al. | |
| 2007/0241445 A1 * | 10/2007 | Ikenaga | H01L 21/4828 257/693 |
| 2007/0278511 A1 * | 12/2007 | Ohno | H01L 24/32 257/99 |
| 2008/0017956 A1 | 1/2008 | Lu et al. | |
| 2008/0135990 A1 * | 6/2008 | Coyle | H01L 21/4828 257/666 |
| 2008/0308886 A1 * | 12/2008 | Ausserlechner | B81C 1/00333 257/421 |
| 2009/0039486 A1 * | 2/2009 | Shimazaki et al. | 257/676 |
| 2009/0072367 A1 * | 3/2009 | Poddar et al. | 257/676 |
| 2009/0079051 A1 | 3/2009 | Amano et al. | |
| 2009/0152691 A1 | 6/2009 | Nguyen et al. | |
| 2009/0152696 A1 * | 6/2009 | Dimasacat | H01L 23/49503 257/676 |
| 2009/0224384 A1 | 9/2009 | Hou et al. | |
| 2009/0236704 A1 * | 9/2009 | Camacho | H01L 24/49 257/670 |
| 2009/0267104 A1 * | 10/2009 | Hsu et al. | 257/99 |
| 2009/0278244 A1 * | 11/2009 | Dunne | H01L 23/481 257/676 |
| 2009/0294932 A1 * | 12/2009 | Sahasrabudhe | H01L 23/49503 257/666 |
| 2009/0309201 A1 | 12/2009 | Morita | |
| 2010/0072589 A1 * | 3/2010 | Camacho | H01L 21/568 257/676 |
| 2010/0109103 A1 * | 5/2010 | Tsao | B81B 7/0064 257/418 |
| 2010/0224971 A1 * | 9/2010 | Li | H01L 21/4832 257/676 |
| 2010/0224972 A1 * | 9/2010 | Powell | H01L 21/4832 257/676 |
| 2010/0320579 A1 * | 12/2010 | Abbott | B23K 26/0078 257/676 |
| 2011/0298116 A1 | 12/2011 | Mizusaki et al. | |
| 2012/0068341 A1 * | 3/2012 | Lieu | H01L 21/56 257/738 |
| 2012/0126418 A1 * | 5/2012 | Feng | H01L 21/563 257/774 |
| 2012/0146238 A1 * | 6/2012 | Su | H01L 21/6836 257/774 |
| 2012/0208323 A1 * | 8/2012 | Heinrich | H01L 24/83 438/123 |
| 2012/0261813 A1 * | 10/2012 | Anderson | H01L 24/11 257/737 |
| 2012/0280376 A1 * | 11/2012 | Do | H01L 21/4832 257/675 |
| 2012/0313131 A1 * | 12/2012 | Oda | H01L 21/6835 257/98 |
| 2013/0154072 A1 * | 6/2013 | Do | H01L 23/3121 257/676 |
| 2013/0228930 A1 * | 9/2013 | Ono | H01L 23/488 257/762 |
| 2013/0277815 A1 * | 10/2013 | Lee | H01L 21/56 257/676 |
| 2013/0292811 A1 * | 11/2013 | Abbott | H01L 23/49541 257/676 |
| 2014/0145318 A1 * | 5/2014 | Otremba et al. | 257/670 |
| 2014/0284777 A1 * | 9/2014 | Otremba | H01L 23/49513 257/666 |

FOREIGN PATENT DOCUMENTS

| | | |
|---|---|---|
| JP | H02-127092 A | 5/1990 |
| JP | H02-144954 A | 6/1990 |
| JP | H04-312933 A | 11/1992 |
| JP | 05-047988 A | 2/1993 |
| JP | 06-085132 A | 3/1994 |
| JP | H06-209054 A | 7/1994 |
| JP | H11-340409 A | 12/1999 |
| JP | 2000-031345 A | 1/2000 |
| JP | 2001-077274 A | 3/2001 |
| JP | 2001-085591 A | 3/2001 |
| JP | 2002-110888 A | 4/2002 |
| JP | 2005-183417 A | 7/2005 |
| JP | 2006080141 A * | 3/2006 |
| JP | 2011-253972 A | 12/2011 |

OTHER PUBLICATIONS

An Office Action; "Notification of Reason(s) for Refusal," issued by the Japanese Patent Office on May 17, 2016, which corresponds to Japanese Patent Application No. 2013-076525 and is related to U.S. Appl. No. 14/152,796; with English language partial translation.

The First Chinese Office Action issued by the Chinese Patent Office on May 23, 2016, which corresponds to Chinese Patent Application No. 201410131059.4 and is related to U.S. Appl. No. 14/152,796; with English language partial translation.

An Office Action; "Notification of Reason(s) for Refusal" issued by the Japanese Patent Office on Dec. 20, 2016, which corresponds to Japanese Patent Application No. 2013-076525 and is related to U.S. Appl. No. 14/152,796; with English language partial translation.

The Second Chinese Office Action issued by the Chinese Patent Office on Jan. 25, 2017, which corresponds to Chinese Patent

(56) References Cited

OTHER PUBLICATIONS

Application No. 201410310594 and is related to U.S. Appl. No. 14/152,796; with English language partial translation.

\* cited by examiner

500

F I G . 6
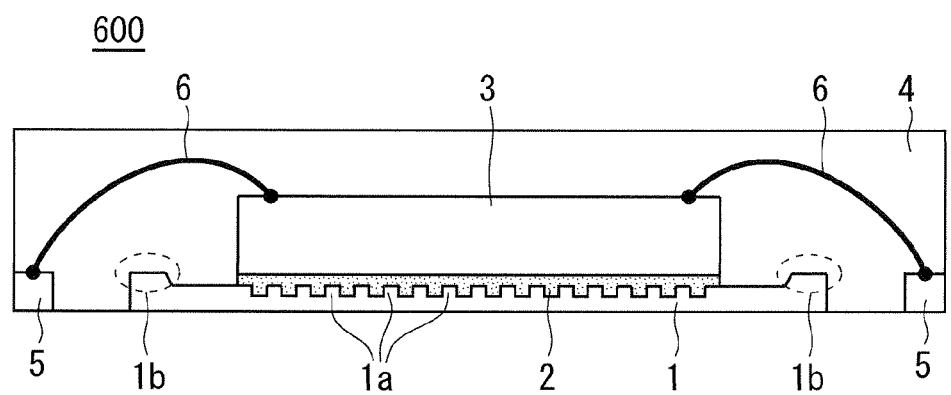
F I G . 7
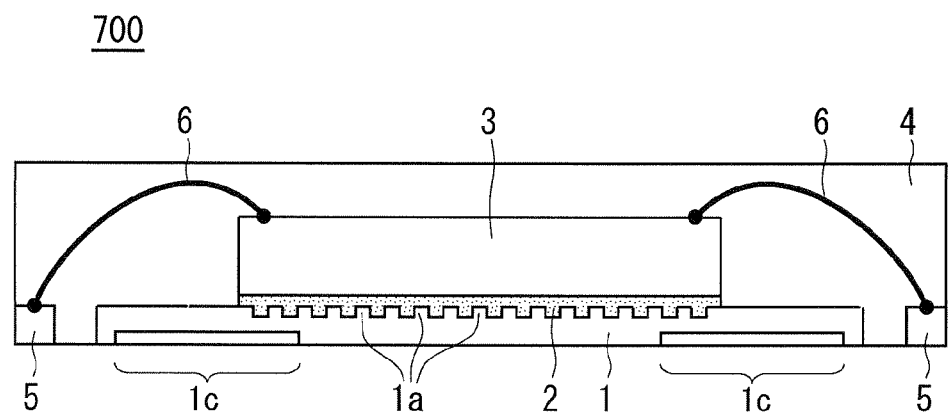

SEMICONDUCTOR DEVICE AND SEMICONDUCTOR MODULE

BACKGROUND OF THE INVENTION

Field of the Invention

The present invention relates to a semiconductor device and a semiconductor module, and particularly relates to a resin-sealed semiconductor device.

Description of the Background Art

As packages for semiconductor chips, there are known no-leads packages such as QFN (quad flat no-leads) and SON (small outline no-leads). In a general no-leads package, a semiconductor chip is bonded by a die bond resin onto a die pad of a lead frame. A terminal of the semiconductor chip is connected with an electrode terminal of the lead frame by wire bonding. The lead frame, the semiconductor chip and wires are sealed by a mold resin (sealing resin) by transfer molding. The die pad and the electrode terminal are exposed on the undersurface of the package.

In the semiconductor package having the foregoing structure, when a temperature cycle of heat generation and cooling is repeated due to a temperature change of an external environment and a temperature change of a semiconductor chip itself, the die bond resin may be detached from the die pad or the semiconductor chip, thus leading to detachment of the die pad and the semiconductor chip. Further, detachment of the die pad and the semiconductor chip may cause occurrence of cracking in the mold resin. When detachment and cracking occur, reliability and a life of the semiconductor package are reduced.

The foregoing detachment and cracking occur due to a difference in linear expansion coefficient among the semiconductor chip, the lead frame, the die bond resin and the mold resin. For example, when the semiconductor chip is formed of silicon and the lead frame is formed of copper, the linear expansion coefficient of the lead frame is larger than the linear expansion coefficient of the semiconductor chip. In this case, the semiconductor package has a flat shape at a normal temperature, but a projected warpage occurs due to thermal stress at a low temperature. Further, a recessed warpage occurs due to thermal stress at a high temperature. With these warpages, the foregoing detachment and cracking occur.

When detachment and cracking reach the outside of the package, it might bring about deterioration in moisture resistance and insulation, leading to reduction in reliability and life of the semiconductor package. Further, when detachment and cracking occur below the semiconductor chip, it might cause deterioration in heat dissipation and degradation in electric connection, leading to reduction in reliability and life of the semiconductor chip.

For example, in Japanese Patent Application Laid-Open No. 6-85132 (1994), a projection/recess shape is formed on the interface between a die pad and a mold resin (resin sealing member), thereby to suppress detachment of the mold resin from the die pad.

As described above, there has been a problem where detachment and cracking that occur inside the semiconductor package cause occurrence of reduction in reliability and life of the semiconductor package. Further, the foregoing technique described in Japanese Patent Application Laid-Open No. 6-85132 (1994) is one for suppressing detachment of the die pad and the mold resin, and not one capable of suppressing detachment of the die pad and the semiconductor chip.

SUMMARY OF THE INVENTION

An object of the present invention is to provide a semiconductor device in which detachment of a die pad and a semiconductor device is suppressed, and a semiconductor module including the semiconductor device.

A semiconductor device according to the present invention includes: a lead frame comprising a die pad and an electrode terminal; and at least one semiconductor chip bonded to the surface of the die pad. In the semiconductor device, the lead frame excluding the bottom surface thereof and the semiconductor chip are sealed by a sealing resin, and an unevenness is introduced on the bonding interface between the surface of the die pad and the semiconductor chip.

According to the present invention, introducing the unevenness on the bonding interface between the die pad and the semiconductor chip increases an area of the bonding interface to further strengthen bonding, and hence detachment of the bonding interface between the die pad and the semiconductor chip tends not to occur even when heat stress occurs on the bonding interface. This can lead to improvement in reliability and life of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a sectional view of a semiconductor device according to a sixth preferred embodiment;

FIG. 7 is a sectional view of a semiconductor device according to a seventh preferred embodiment;

DESCRIPTION OF THE PREFERRED EMBODIMENTS

First Preferred Embodiment

<Configuration>

Figure 1:
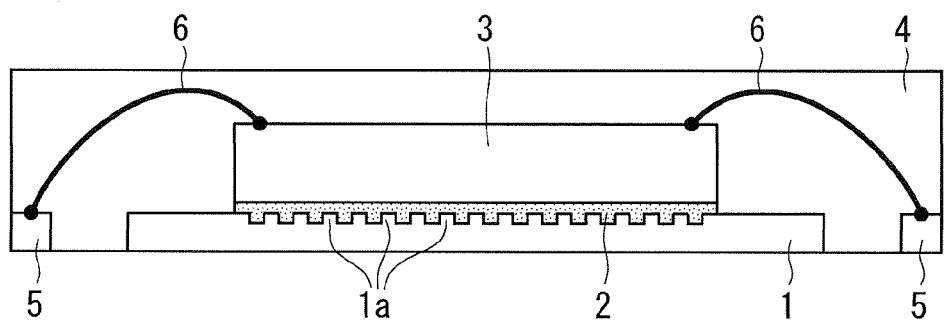
FIG. 1 is a sectional view of a semiconductor device according to a first preferred embodiment.

FIG. 1 shows a sectional view of a semiconductor device 100 in the present preferred embodiment. The semiconductor device 100 is a no-leads package such as QFN or SON. The lead frame is configured of the die pad 1 and the electrode terminal 5. A semiconductor chip 3 is bonded onto the die pad 1 through a die bond resin 2.

Each terminal (not shown) on the top surface of the semiconductor chip 3 is connected to the electrode terminal 5 through a wire 6. The lead frame, the semiconductor chip 3 and the wires 6 are sealed by a sealing resin 4. It is to be noted that the bottom surface of the lead frame is not sealed but exposed to the outside. In the semiconductor device 100, unevenness in which projections and recesses are repeated is introduced on the bonding interface between the die pad 1 and semiconductor chip 3. More specifically, the unevenness on the bonding interface is introduced by forming an unevenness portion 1*a*, in which projections and recesses are repeated, on the surface of the die pad 1.

As for a method for forming the unevenness portion 1*a* on the surface of the die pad 1, there is used a mechanical method such as punching or laser processing or a chemical method such as etching.

It is to be noted that as the semiconductor chip 3, a wide band gap semiconductor such as SiC or GaN may be used. Generally, a semiconductor chip made of SiC, GaN or the like is operable at a higher temperature than a semiconductor chip made of silicon, but this leads to an increase in width of a temperature cycle in accordance with a usage temperature environment and a self-heat generation, thereby causing a problem such as detachment and cracking due to an increase in thermal stress. In the present preferred embodiment, the unevenness is introduced on the bonding interface, to further strength bonding between the semiconductor chip 3 and the die pad 1, and hence it is possible to suppress occurrence of detachment, cracking and the like due to an increase in thermal stress.

Further, in the present preferred embodiment, a thickness of the semiconductor chip 3 may be made smaller than a thickness of the die pad 1. The semiconductor chip 3 has a small linear expansion coefficient as compared with those of the other constitutional components (the lead frame, the sealing resin 4, and the die bond resin 2). Since the lead frame is configured of metal with a relatively large linear expansion coefficient, such as copper, when the thickness of the semiconductor chip 3 is larger than the thickness of the die pad 1, a difference in expansion among the constitutional components becomes large, and deformation (warpage) due to thermal stress thus becomes large. On the other hand, when the thickness of the semiconductor chip 3 is made smaller than the thickness of the die pad 1, the difference in expansion among the constitutional components becomes small, and the deformation due to thermal stress can thus be made small. By the deformation due to thermal stress becoming small, it is possible to suppress occurrence of detachment and cracking, and the like.

Further, in the present preferred embodiment, when a thickness of the sealing resin 4 is made small, rigidity of the package itself becomes small, and a warpage deformation amount becomes large. On the other hand, by making the thickness of the sealing resin 4 large, namely by making a height of the sealing resin 4 large in FIG. 1, the rigidity of the package itself becomes high, thus making it possible to suppress a warpage due to thermal stress. Accordingly, it is possible to suppress occurrence of detachment and cracking.

<Effect>

The semiconductor device 100 according to the present preferred embodiment includes: a lead frame provided with the die pad 1 and the electrode terminal 5; and at least one semiconductor chip 3 bonded to the surface of the die pad 1. The semiconductor device 100 is characterized in that the lead frame excluding the bottom surface thereof and the semiconductor chip 3 are sealed by the sealing resin 4, and an unevenness is introduced on the bonding interface between the surface of the die pad 1 and the semiconductor chip 3.

Accordingly, introducing the unevenness on the bonding interface between the die pad 1 and the semiconductor chip 3 increases an area of the bonding interface to further strengthen bonding by the die bond resin 2, and hence detachment of the bonding interface between the die pad 1 and the semiconductor chip 3 tends not to occur even when heat stress occur on the bonding interface. This can lead to improvement in reliability and life of the semiconductor device 100.

Further, the semiconductor device 100 in the present preferred embodiment is characterized in that the unevenness portion 1*a* is formed on the surface of the die pad 1, to introduce the unevenness on the bonding interface.

Accordingly, forming the unevenness portion 1*a* on the surface of the die pad 1 increases an area of the bonding interface between the surface of the die pad 1 and the die bond resin 2, and hence the die bond resin 2 tends not to be detached from the die pad 1. This can lead to improvement in reliability and life of the semiconductor device 100.

Moreover, the semiconductor device 100 in the present preferred embodiment is characterized in that the thickness of the semiconductor chip 3 is smaller than the thickness of the die pad 1.

Accordingly, a decrease in thickness of the semiconductor chip 3 leads to a decreased volume, thereby reducing thermal stress due to bonding between the die pad 1 and the semiconductor chip 3. Hence it is possible to suppress detachment of the bonding interface and occurrence of cracking in the sealing resin 4.

Furthermore, the semiconductor device 100 in the present preferred embodiment is characterized in that the semiconductor chip 3 includes a wide band gap semiconductor.

Accordingly, even when the semiconductor chip 3 is made of a wide band gap semiconductor that is operated at a high temperature, bonding by the die bond resin 2 is further strengthened due to the unevenness on the bonding interface, and hence it is possible to suppress detachment and the like that occur due to thermal stress.

Second Preferred Embodiment

Figure 2:
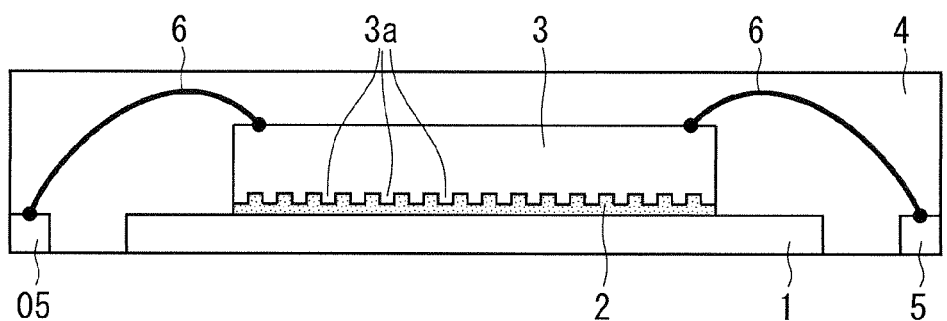
FIG. 2 is a sectional view of a semiconductor device according to a second preferred embodiment.

FIG. 2 shows a sectional view of a semiconductor device 200 in the present preferred embodiment. In the semiconductor device 200, an unevenness is introduced on the interface bonded by the die bond resin 2 between the semiconductor chip 3 and the die pad 1. More specifically, the unevenness on the bonding interface is introduced by forming an unevenness portion 3*a* on the undersurface of the semiconductor chip 3.

As for a method for forming the unevenness portion 3*a* on the undersurface of the semiconductor chip 3, there is used a mechanical method such as laser processing or a chemical method such as etching. It is to be noted that, when this unevenness portion 3*a* is formed in a rear surface processing step in a semiconductor wafer process, an increase in number of steps can be suppressed.

<Effect>

In the semiconductor device 200 in the present preferred embodiment, the unevenness portion 3*a* is formed on the semiconductor chip 3, to introduce the unevenness on the bonding interface.

Accordingly, forming the unevenness portion 3*a* on the semiconductor chip 3 increases an area of the bonding interface between the bottom surface of the semiconductor chip 3 and the die bond resin 2, and hence the die bond resin 2 tends not to be detached from the semiconductor chip 3. This can lead to improvement in reliability and life of the semiconductor device 100.

Third Preferred Embodiment

Figure 3:
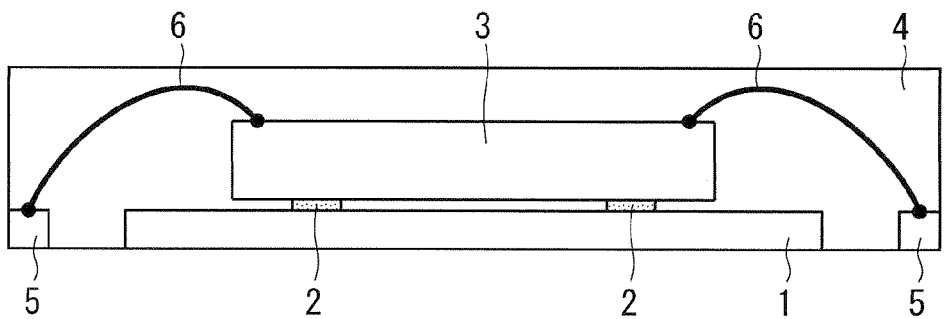
FIG. 3 is a sectional view of a semiconductor device according to a third preferred embodiment.

FIG. 3 shows a sectional view of a semiconductor device 300 in the present preferred embodiment. In the semiconductor device 300, the die pad 1 and the semiconductor chip 3 are partially bonded by the die bond resin 2. The other configurations are the same as those in the first preferred embodiment, and descriptions thereof will thus be omitted.

It is to be noted that the wide band gap semiconductor such as SiC or GaN may be used as the semiconductor chip 3 in the same manner as in the first preferred embodiment.

Further, in the present preferred embodiment, the thickness of the semiconductor chip 3 may be made smaller than the thickness of the die pad 1 in the same manner as in the first preferred embodiment. When the thickness of the semiconductor chip 3 is made smaller, the difference in expansion among the constitutional components becomes small, and deformation due to thermal stress can thus be made small.

Moreover, in the present preferred embodiment, the sealing resin 4 may be designed to have a large thickness in the same manner as in the first preferred embodiment. By making the thickness of the sealing resin 4 large, the rigidity of the package itself becomes high, thus making it possible to suppress a warpage due to thermal stress. Accordingly, it is possible to suppress occurrence of detachment and cracking.

<Effect>

The semiconductor device 300 according to the present preferred embodiment includes: a lead frame provided with the die pad 1 and the electrode terminal 5; and at least one semiconductor chip 3 bonded to the surface of the die pad 1. The semiconductor device 300 is characterized in that the lead frame excluding the bottom surface thereof and the semiconductor chip 3 are sealed by the sealing resin 4, and the die pad 1 and the semiconductor chip 3 are partially bonded.

Accordingly, partially bonding the die pad 1 with the semiconductor chip 3 leads to reduction in area of the bonding interface, thereby reducing a warpage that occurs due to a difference in linear expansion coefficient between the die pad 1 and the semiconductor chip 3. With the warpage reduced, it is possible to suppress detachment of the die bond resin 2, cracking that occurs in the sealing resin 4, and the like. This can lead to improvement in reliability and life of the semiconductor device 300. The reliability is especially one with respect to moisture resistance, and the life is especially one with respect to a temperature cycle.

Fourth Preferred Embodiment

<Configuration>

Figure 4A:
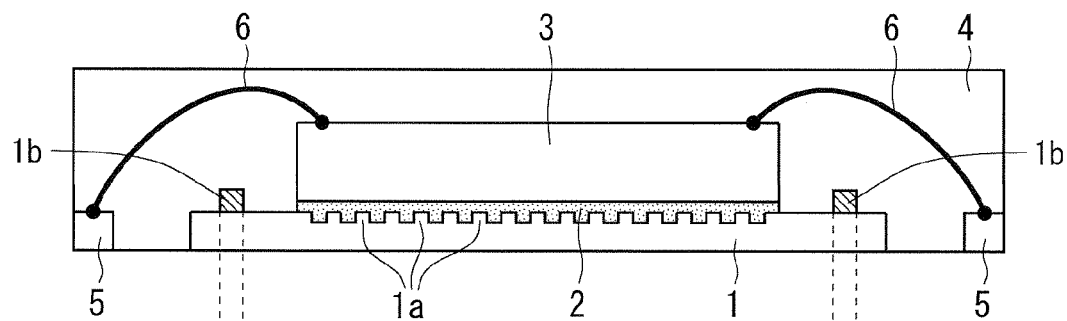
FIGS. 4A and 4B are a sectional view and a plan view of a semiconductor device according to a fourth preferred embodiment.
Figure 4B:
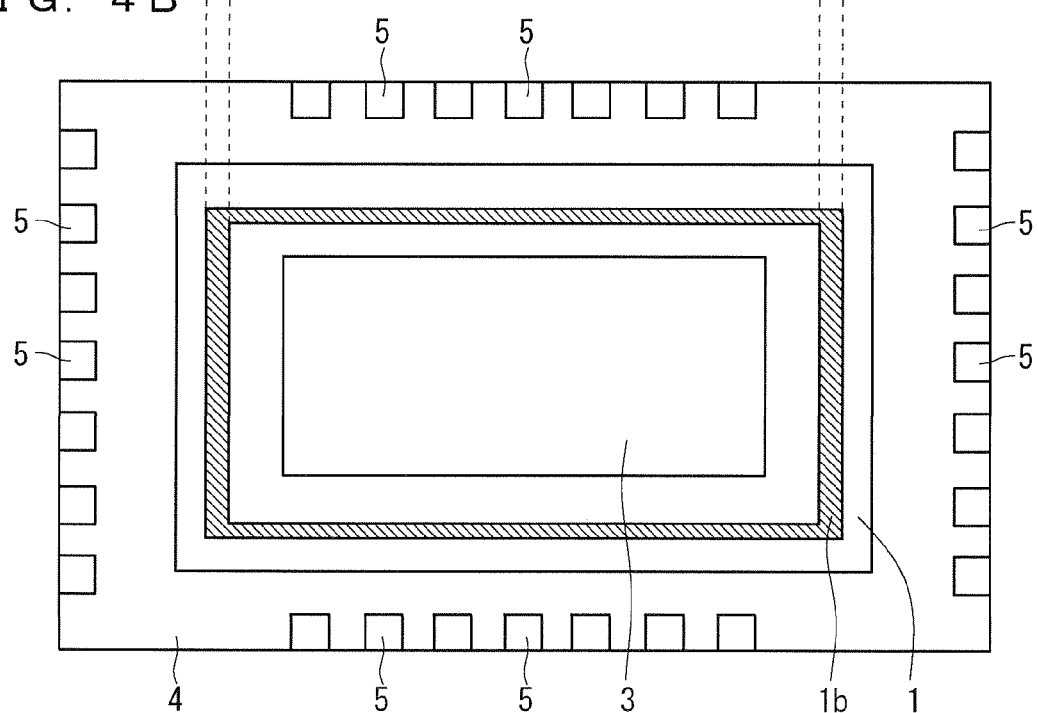

FIGS. 4A and 4B respectively show a sectional view and a plan view of a semiconductor device 400 in the present preferred embodiment. In the semiconductor device 400 in the present preferred embodiment, a protrusion 1b surrounding the semiconductor chip 3 in a planar view is further formed on the surface of the die pad 1 with respect to the semiconductor device 100 (FIG. 1) in the first preferred embodiment. The other configurations are the same as those in the first preferred embodiment (FIG. 1), and descriptions thereof will thus be omitted.

The protrusion 1b formed on the surface of the die pad 1 is, for example, formed by mechanical processing such as partial raising of the die pad 1 by punching.

Further, the die pad 1 and the protrusion 1b may be configured of different members. That is, a member in the shape of surrounding the semiconductor chip 3 may be separately prepared, and mounted on the surface of the die pad 1.

It is to be noted that the bonding interface between the die pad 1 and semiconductor chip 3 may be configured as in the second preferred embodiment (i.e., semiconductor device 200 of FIG. 2) or the third preferred embodiment (i.e., semiconductor device 300 of FIG. 3).

<Effect>

The semiconductor device 400 in the present preferred embodiment is characterized in that the protrusion 1b surrounding the semiconductor chip 3 in a planar view is formed on the surface of the die pad 1.

Therefore, even when detachment and cracking occur on the bonding interface between the die pad 1 and the semiconductor chip, the progress of these can be suppressed by the protrusion 1b. Accordingly, it is possible to suppress detachment and cracking from reaching the outside of the package, so as to improve the reliability and the life of the semiconductor device 400.

The semiconductor device 400 in the present preferred embodiment is characterized in that the protrusion 1b and the die pad 1 are formed of different members.

Therefore, forming the protrusion 1b and the die pad 1 of different members eliminates the need for mechanical processing such as punching and allows provision of the protrusion 1b in a desired shape at a desired position.

Fifth Preferred Embodiment

Figure 5A:
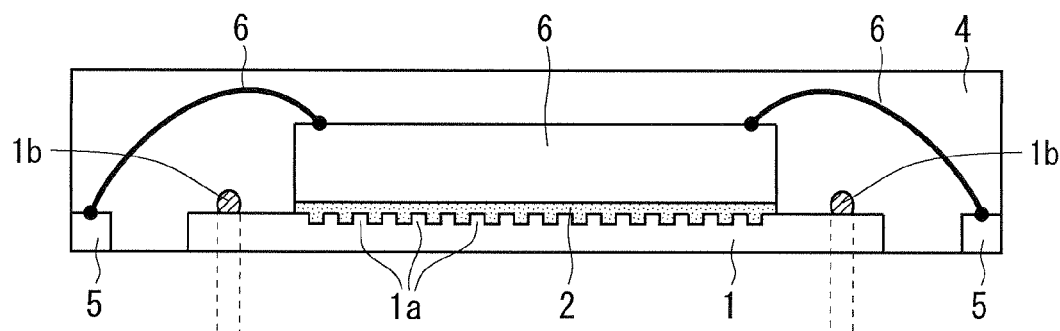
FIGS. 5A and 5B are a sectional view and a plan view of a semiconductor device according to a fifth preferred embodiment.
Figure 5B:
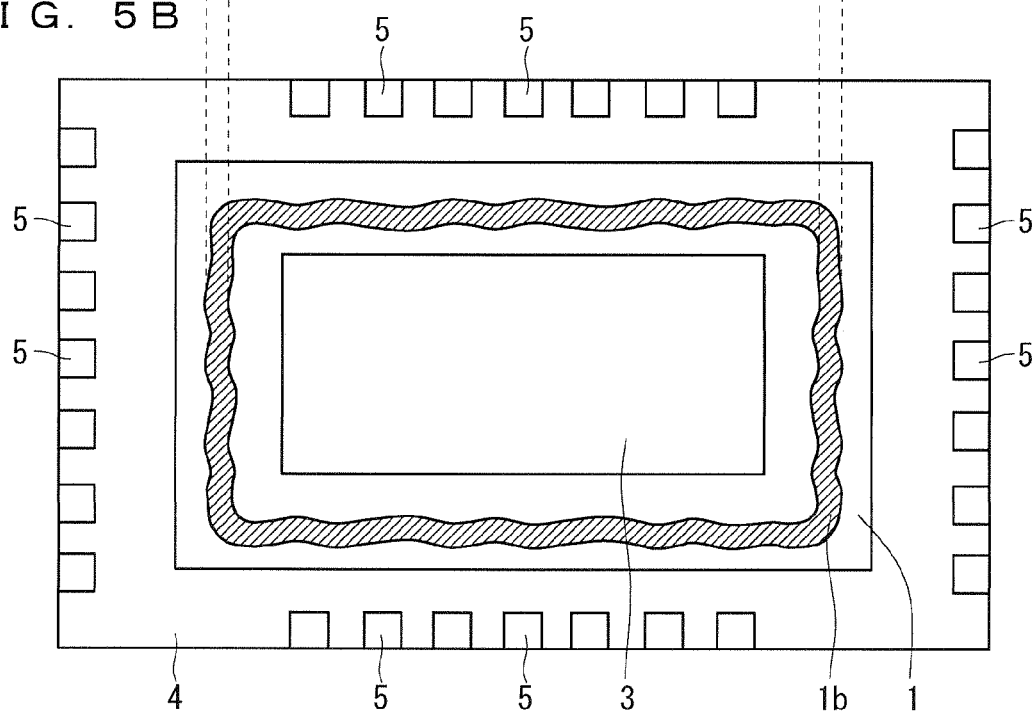

FIGS. 5A and 5B respectively show a sectional view and a plan view of a semiconductor device 500 in the present preferred embodiment. In the semiconductor device 500 in the present preferred embodiment, the protrusion 1b surrounding the semiconductor chip 3 in a planar view is formed on the surface of the die pad 1 in the same manner as in the fourth preferred embodiment (FIGS. 4A and 4B). The protrusion 1b is formed by wire bonding. The other configurations are the same as those in the fourth preferred embodiment (FIGS. 4A and 4B), and descriptions thereof will thus be omitted.

When a material for the protrusion 1b formed on the surface of the die pad 1 is a gold wire, the protrusion 1b can be simultaneously formed in the step of mounting the wire 6 by wire bonding. Hence it is possible to provide the protrusion 1b without increasing the number of steps.

Further, the protrusion 1b may be formed of an aluminum wire thicker than the gold wire. Forming the protrusion 1b of the aluminum wire can make the protrusion 1b higher.

<Effect>

The semiconductor device 500 in the present preferred embodiment is characterized in that the protrusion 1b is formed of the wire by wire bonding.

Therefore, even when the protrusion 1b is formed by wire bonding, a similar effect to the effect described in the fourth preferred embodiment can be obtained. Further, when the protrusion 1b is simultaneously formed in the step of mounting the wire 6 by wire bonding, it is possible to form the protrusion 1b without increasing the number of steps.

Moreover, in the semiconductor device 500 in the present preferred embodiment, the protrusion 1b is formed of the aluminum wire by wire bonding.

Accordingly, forming the protrusion 1b of the aluminum wire can make the wire thicker as compared with the case of forming the protrusion 1b of the gold wire. Therefore, since the height of the protrusion 1b can be made large, it is possible to further suppress detachment and cracking from reaching the outside of the package.

Sixth Preferred Embodiment

FIG. 6 shows a sectional view of a semiconductor device 600 in the present preferred embodiment. In the semiconductor device 600 in the present preferred embodiment, the protrusion 1b surrounding the semiconductor chip 3 in a planar view is formed on the surface of the die pad 1 in the same manner as in the fourth preferred embodiment (FIGS.

4A and 4B). The protrusion 1b is formed by scraping off the surface of the die pad 1. The other configurations are the same as those in the fourth preferred embodiment (FIGS. 4A and 4B), and descriptions thereof will thus be omitted.

The protrusion 1b is formed by scraping off a portion other than the protrusion 1b off the surface of the die pad 1 by chemical processing such as etching or mechanical processing such as punching or laser processing. Further, scraping off the surface of the die pad 1 makes the thickness of the die pad 1 small, thus leading to reduction in thermal stress that occurs between the semiconductor chip 3 and the die pad 1.

<Effect>

The semiconductor device 600 in the present preferred embodiment is characterized in that the protrusion 1b is formed by scraping off the surface of the die pad 1.

Therefore, by forming the protrusion 1b, it is possible to obtain a similar effect to the effect described in the fourth preferred embodiment. Further, by scraping off the surface of the die pad 1 to form the protrusion 1b, the thickness of the die pad 1 becomes small by a height of the protrusion 1b, thus leading to reduction in thermal stress that occurs between the semiconductor chip 3 and the die pad 1. Hence it is possible to suppress detachment of the die bond resin 2, cracking that occurs in the sealing resin 4, and the like.

Seventh Preferred Embodiment

<Configuration>

FIG. 7 shows a sectional view of a semiconductor device 700 in the present preferred embodiment. In the semiconductor device 700 in the present preferred embodiment, a recess portion 1c is further formed on the bottom surface of the die pad 1 with respect to the semiconductor device 100 (FIG. 1) in the first preferred embodiment. The other configurations are the same as those in the first preferred embodiment (FIG. 1), and descriptions thereof will thus be omitted.

The recess portion 1c is formed such that at least a part thereof overlaps with the semiconductor chip 3 in a planar view. That is, the recess portion 1c is located below the bonding interface between the semiconductor chip 3 and the die pad 1. Forming the recess portion 1c leads to a decreased volume of the die pad 1 below the bonding interface, thus reducing thermal stress that occurs between the semiconductor chip 3 and the die pad 1. It is to be noted that the recess portion 1c is filled with the sealing resin 4.

It is to be noted that in the present preferred embodiment, the wide band gap semiconductor such as SiC or GaN may be used as the semiconductor chip 3 in the same manner as in the first preferred embodiment.

Further, in the present preferred embodiment, the thickness of the semiconductor chip 3 may be made smaller than the thickness of the die pad 1 in the same manner as in the first preferred embodiment. When the thickness of the semiconductor chip 3 is made smaller, the difference in expansion among the constitutional components becomes small, and deformation due to thermal stress can thus be made small.

Moreover, in the present preferred embodiment, the sealing resin 4 may be designed to have a large thickness in the same manner as in the first preferred embodiment. By making the thickness of the sealing resin 4 large, the rigidity of the package itself becomes high, thus making it possible to suppress a warpage due to thermal stress. Accordingly, it is possible to suppress occurrence of detachment and cracking.

<Effect>

The semiconductor device 700 in the present preferred embodiment is characterized in that the recess portion 1c is formed on the bottom surface of the die pad, and at least a part of the recess portion 1c overlaps with the semiconductor chip 3 in a planar view.

Therefore, the volume of the die pad 1 decreases below the bonding interface between the semiconductor chip 3 and the die pad 1, thus reducing thermal stress that occurs between the semiconductor chip 3 and the die pad 1. By reduction in thermal stress, it is possible to suppress detachment of the die bond resin 2, cracking that occurs in the sealing resin 4, and the like. This can lead to improvement in reliability and life of the semiconductor device 700. The reliability is especially one with respect to moisture resistance, and the life is especially one with respect to a temperature cycle.

Eighth Preferred Embodiment

<Configuration>

Figure 8:
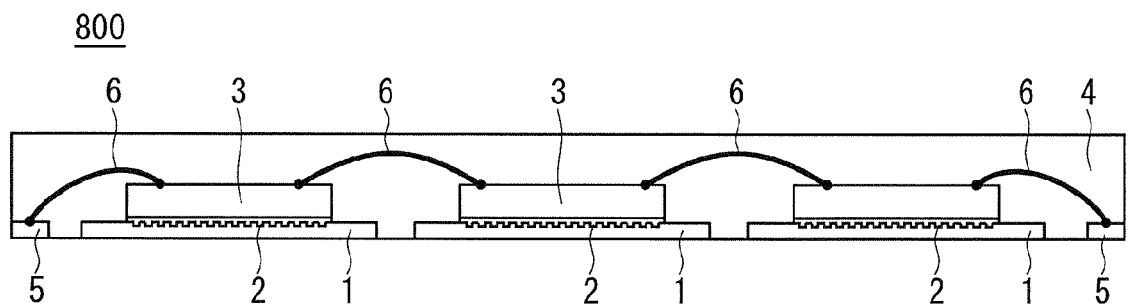
FIG. 8 is a sectional view of a semiconductor device according to an eighth preferred embodiment.

FIG. 8 shows a sectional view of a semiconductor device 800 in the present preferred embodiment. The semiconductor device 800 in the present preferred embodiment includes a plurality of semiconductor chips 3. Further, the lead frame is provided with a plurality of die pads 1. Each of the semiconductor chips 3 is bonded with each of the die pads 1 by the die bond resin 2 in the same manner as in the first preferred embodiment (FIG. 1). The other configurations are the same as those in the first preferred embodiment, and descriptions thereof will thus be omitted.

In a case where a plurality of semiconductor chips are adjacently arranged, there has been a problem in that, when a warpage occurs due to thermal stress in the semiconductor chip that is operated at a high temperature, deformation caused by the warpage also affects the semiconductor chip 3 and the like therearound. This is particularly problematic when the silicon-made semiconductor chip 3 is arranged adjacently to the semiconductor chip 3 that is operable at a high temperature, such as SiC or GaN.

In the present preferred embodiment, with the semiconductor chip 3 being more strongly bonded with the die pad 1 in the same manner as in the first preferred embodiment, even when thermal stress occurs between the die pad 1 and the semiconductor chip 3 that is operated at a high temperature, occurrence of detachment and cracking can be suppressed. Further, even when a warpage occurs between the die pad 1 and another semiconductor chip 3 adjacent to the semiconductor chip 3 that is operated at a high temperature, since the semiconductor chip 3 is strongly bonded with the die pad 1, occurrence of detachment and cracking can be suppressed.

It is to be noted that in the present preferred embodiment, even when the bonding interface between the semiconductor chip 3 and the die pad 1 is configured as in the second preferred embodiment (FIG. 2), a similar effect can be obtained.

Further, when the bonding interface between the semiconductor chip 3 and the die pad 1 is configured as in the third preferred embodiment (FIG. 3), since thermal stress itself can be reduced, a warpage is suppressed, and hence the semiconductor chip 3 that is operated at a high temperature and the semiconductor chip 3 that is operated at a comparatively low temperature can be adjacently arranged.

Further, as in the fourth to sixth preferred embodiments (FIGS. 4A to 6), the protrusion 1b may be formed on the surface of the die pad 1 so as to surround each semiconductor chip 3. Moreover, the recess portion 1c may be provided on the bottom surface of the die pad 1 as in the seventh preferred embodiment (FIG. 7).

<Effect>

The semiconductor device 800 in the present preferred embodiment is characterized in that at least one semiconductor chip 3 includes a plurality of semiconductor chips. Therefore, since occurrence of detachment, cracking and the like can be suppressed in each semiconductor chip 3, even when the plurality of semiconductor chips 3 are adjacently arranged, the reliability can be held. This allows adjacent arrangement of the semiconductor chips with different operating temperatures, thus leading to improvement in degree of design freedom.

Ninth Preferred Embodiment

<Configuration>

Figure 9:
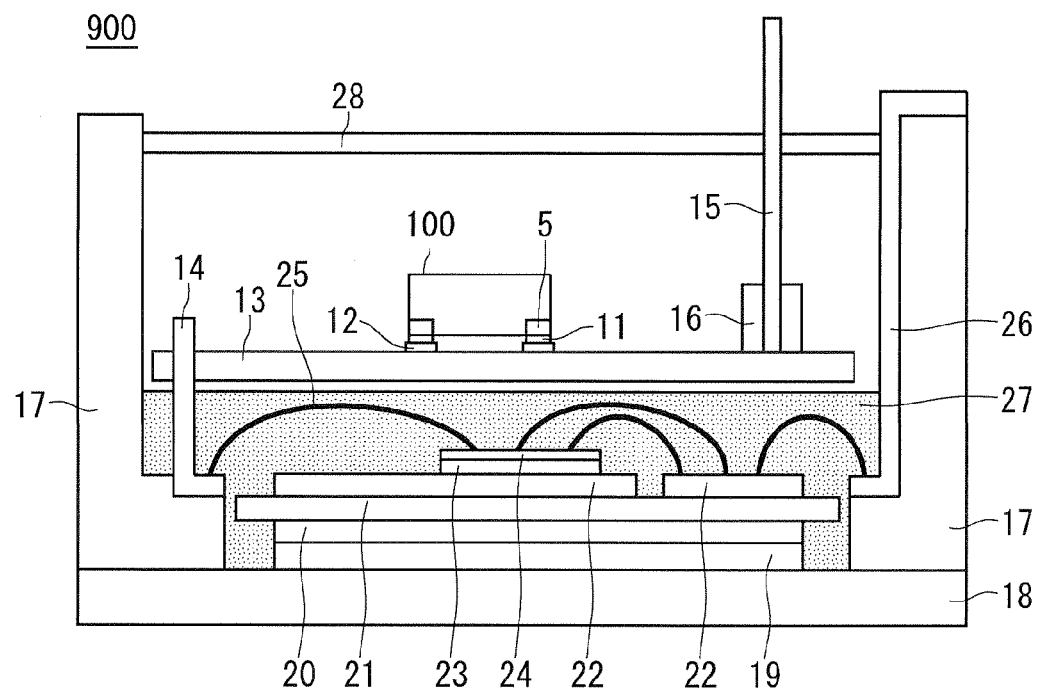
FIG. 9 is a sectional view of a semiconductor device according to a ninth preferred embodiment.

FIG. 9 shows a sectional view of a semiconductor module 900 according to the present preferred embodiment. The semiconductor module 900 includes the semiconductor device 100 in the first preferred embodiment and a power semiconductor chip 24. The electrode terminal 5 of the semiconductor device 100 is connected to a land 12 on a control substrate 13 through solder 11.

The control substrate 13 is connected to a relay terminal 14. Further, the control substrate 13 is connected with an external terminal 15 through a terminal fixing member 16. The relay terminal 14 is buried into a case 17 for the semiconductor module.

The case 17 is fixed to a base plate 18, and an insulating substrate 21 formed with wiring patterns 20, 22 on both surfaces thereof is arranged on the base plate 18 through solder 19. The power semiconductor chip 24 is connected to the wiring pattern 22 through solder 23. The power semiconductor chip 24, the wiring pattern 22, the relay terminal 14 and an external terminal 26 are appropriately connected through wires 25. The power semiconductor chip 24, the wires 25 and the insulating substrate 21 are sealed by silicon gel 27. Further, the inside of the case 17 is hermetically sealed by a lid 28.

In the present preferred embodiment, as the semiconductor chip 24, the wide band gap semiconductor such as SiC or GaN may be used. The semiconductor chip using as its material the wide band gap semiconductor such as SiC or GaN can be operated at a higher temperature than the silicon-made semiconductor chip, thereby increasing a width of a temperature cycle in accordance with a usage environment temperature and self-heat generation. Since the semiconductor device 100 is capable of suppressing occurrence of detachment and cracking due to thermal stress as described in the first preferred embodiment, it can also be mounted in the semiconductor module 900 that is operated in such a temperature environment.

It is to be noted that the semiconductor device 200, 300, 400, 500, 600, 700 or 800 may be mounted in place of the semiconductor device 100.

<Effect>

The semiconductor module 900 in the present preferred embodiment includes the semiconductor device 100 and a power semiconductor chip 24.

Therefore, since the semiconductor device 100 has the configuration capable of suppressing detachment and cracking due to thermal stress as described in the first preferred embodiment, even when the semiconductor device 100 is mounted in the semiconductor module 900 whose temperature becomes high by heat generation of the power semiconductor chip 24, the reliability can be held. Further, since the no-leads semiconductor device 100 can be mounted, the semiconductor module 900 can be reduced in size.

The semiconductor module 900 in the present preferred embodiment is characterized in that the power semiconductor chip 24 includes the wide band gap semiconductor.

Therefore, when the power semiconductor chip 24 is the wide band gap semiconductor such as SiC or GaN, the temperature of the semiconductor module 900 may become higher at the time of operation thereof, but the semiconductor device 100 has the configuration capable of suppressing detachment and cracking due to thermal stress, and hence it is also mountable in such a semiconductor module 900.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a lead frame comprising a die pad and an electrode terminal; and
   at least one semiconductor chip bonded to a surface of said die pad via a die bond resin provided therebetween, wherein
   said lead frame excluding a bottom surface thereof and said semiconductor chip are sealed by a sealing resin,
   an unevenness is introduced only on a bonding interface between the surface of said die pad and said semiconductor chip,
   said unevenness is introduced on said bonding interface by forming an unevenness portion on the surface of said die pad,
   a projecting surface of said unevenness does not protrude beyond an upper lead frame surface of said lead frame,
   portions of said die bond resin are positioned in said unevenness,
   said die bond resin extends along an entire bottom surface of said semiconductor chip, and
   top surfaces of said unevenness are coplanar with top surfaces of portions of said die pad that are immediately adjacent to said electrode terminal.

2. The semiconductor device according to claim 1, wherein a protrusion surrounding said semiconductor chip in a planar view is formed on the surface of said die pad.

3. The semiconductor device according to claim 2, wherein said protrusion and said die pad are formed of different members.

4. The semiconductor device according to claim 2, wherein said protrusion is formed of a wire, and said wire has curved surfaces in a side cross sectional view.

5. The semiconductor device according to claim 4, wherein said protrusion is an aluminum wire by wire bonding.

6. The semiconductor device according to claim 2, wherein said protrusion is formed by scraping off the surface of said die pad.

7. The semiconductor device according to claim 2, wherein said protrusion is raised above said bonding interface, and
   wherein a top portion and both sides of said protrusion are sealed by said sealing resin in a side cross-sectional view.

8. The semiconductor device according to claim 1, wherein
   a recess portion is formed on the bottom surface of said die pad,
   at least a part of said recess portion overlaps with said semiconductor chip in a planar view, and at least another part of said recess portion extends laterally beyond an edge of said semiconductor chip in said planar view.

9. The semiconductor device according to claim 1, wherein a thickness of said semiconductor chip is smaller than a thickness of said die pad.

10. The semiconductor device according to claim 1, wherein said semiconductor chip includes a wide band gap semiconductor.

11. The semiconductor device according to claim 1, wherein said at least one semiconductor chip includes a plurality of semiconductor chips.

12. A semiconductor module, comprising:
the semiconductor device according to claim 1, and
a power semiconductor chip, wherein
said semiconductor device is vertically stacked above said power semiconductor chip inside a case.

13. The semiconductor module according to claim 12, wherein said power semiconductor chip includes a wide band gap semiconductor.

14. A semiconductor device, comprising:
a lead frame comprising a die pad and an electrode terminal; and
at least one semiconductor chip bonded to a surface of said die pad via a die bond resin provided therebetween, wherein
said lead frame excluding a bottom surface thereof and said semiconductor chip are sealed by a sealing resin,
an unevenness is introduced only on a bonding interface between the surface of said die pad and said semiconductor chip,
said unevenness is introduced on said bonding interface by forming an unevenness portion on the surface of said die pad,
a projecting surface of said unevenness does not protrude beyond an upper lead frame surface of said lead frame,
portions of said die bond resin are positioned in said unevenness,
said die bond resin extends along an entire bottom surface of said semiconductor chip, and said unevenness extends along said entire bottom surface of said semiconductor chip.

* * * * *